United States Patent
De Boer

(10) Patent No.: US 7,921,802 B2
(45) Date of Patent: Apr. 12, 2011

(54) SYSTEM AND METHOD FOR SUPPRESSION OF WAFER TEMPERATURE DRIFT IN COLD-WALL CVD SYSTEMS

(75) Inventor: Wiebe De Boer, Hopewell Junction, NY (US)

(73) Assignee: NXP B.V., Eindhoven (NL)

( * ) Notice: Subject to any disclaimer, the term of this patent is extended or adjusted under 35 U.S.C. 154(b) by 751 days.

(21) Appl. No.: 10/537,363

(22) PCT Filed: Nov. 26, 2003

(86) PCT No.: PCT/IB03/05447
§ 371 (c)(1),
(2), (4) Date: Jun. 2, 2005

(87) PCT Pub. No.: WO2004/053946
PCT Pub. Date: Jun. 24, 2004

(65) Prior Publication Data
US 2006/0057826 A1 Mar. 16, 2006

Related U.S. Application Data

(60) Provisional application No. 60/431,841, filed on Dec. 9, 2002.

(51) Int. Cl.
*C23C 16/00* (2006.01)
*C23C 16/44* (2006.01)
*C23C 16/46* (2006.01)
*C23C 16/458* (2006.01)
*C23C 16/52* (2006.01)
*H01L 21/3065* (2006.01)

(52) U.S. Cl. ........ 118/696; 118/666; 118/715; 118/724; 118/725; 118/728; 118/730; 427/8; 427/248.1

(58) Field of Classification Search ............... 118/666, 118/696, 715, 724, 725, 728, 730; 427/8, 427/248.1; 156/345.27, 345.52
See application file for complete search history.

(56) References Cited

U.S. PATENT DOCUMENTS

| | | | | |
|---|---|---|---|---|
| 3,513,704 | A | * | 5/1970 | Hatcher .................. 374/161 |
| 3,567,895 | A | * | 3/1971 | Paz ............... 219/667 |
| 3,698,813 | A | * | 10/1972 | Aisenberg .................. 356/48 |
| 5,226,732 | A | * | 7/1993 | Nakos et al. ................. 374/133 |
| 5,403,433 | A | * | 4/1995 | Morrison et al. .............. 216/60 |
| 5,599,397 | A | * | 2/1997 | Anderson et al. ............. 118/728 |
| 5,689,614 | A | * | 11/1997 | Gronet et al. .................. 392/416 |
| 5,782,974 | A | * | 7/1998 | Sorensen et al. ................ 117/82 |

(Continued)

FOREIGN PATENT DOCUMENTS

EP 1367637 A 12/2003

(Continued)

OTHER PUBLICATIONS

PCT Invitation to pay Additional Fees, Jun. 17, 2004, pp. 4.

*Primary Examiner* — Jeffrie R Lund

(57) ABSTRACT

An apparatus and corresponding method are disclosed that uses one or more optical fibers in a susceptor that monitor radiation emitted by the backside of the susceptor. The optical fibers are filtered and converted into an electrical signal. A control system is used to maintain a constant wafer temperature by keeping the electrical signal constant during the deposition cycle. This overcomes problems caused by varying wafer temperature during non-selective epitaxial and polysilicon growth on patterned wafers at low temperatures and reduced pressure.

20 Claims, 3 Drawing Sheets

U.S. PATENT DOCUMENTS

| | | | | |
|---|---|---|---|---|
| 5,790,751 A * | 8/1998 | Gronet et al. | | 392/416 |
| 5,830,277 A * | 11/1998 | Johnsgard et al. | | 118/725 |
| 5,937,142 A * | 8/1999 | Moslehi et al. | | 392/416 |
| 5,998,767 A * | 12/1999 | Kersch et al. | | 219/390 |
| 6,100,506 A * | 8/2000 | Colelli et al. | | 219/446.1 |
| 6,123,766 A * | 9/2000 | Williams et al. | | 117/85 |
| 6,140,612 A * | 10/2000 | Husain et al. | | 219/390 |
| 6,146,242 A * | 11/2000 | Treur et al. | | 451/6 |
| 6,151,447 A * | 11/2000 | Moore et al. | | 392/418 |
| 6,167,195 A * | 12/2000 | Moslehi et al. | | 392/418 |
| 6,191,399 B1 * | 2/2001 | Van Bilsen | | 219/497 |
| 6,200,634 B1 * | 3/2001 | Johnsgard et al. | | 427/248.1 |
| 6,303,895 B1 * | 10/2001 | Husain et al. | | 219/121.4 |
| 6,359,263 B2 * | 3/2002 | Tay et al. | | 219/411 |
| 6,406,179 B2 * | 6/2002 | Adams et al. | | 374/131 |
| 6,596,973 B1 * | 7/2003 | Donald et al. | | 219/390 |
| 6,849,831 B2 * | 2/2005 | Timans et al. | | 219/390 |
| 6,876,816 B2 * | 4/2005 | Shigeoka et al. | | 392/411 |
| 6,884,458 B2 * | 4/2005 | Liu | | 427/9 |
| 6,891,124 B2 * | 5/2005 | Denton et al. | | 219/121.54 |
| 6,924,463 B2 * | 8/2005 | Donald et al. | | 219/390 |
| 6,941,063 B2 * | 9/2005 | Camm et al. | | 392/416 |
| 7,041,931 B2 * | 5/2006 | Jennings et al. | | 219/390 |
| 7,112,763 B2 * | 9/2006 | Hunter et al. | | 219/411 |
| 7,234,862 B2 | 6/2007 | Johnson et al. | | |
| 7,560,007 B2 * | 7/2009 | Gaff | | 156/345.27 |
| 7,667,162 B2 * | 2/2010 | Aderhold et al. | | 219/494 |
| 7,672,750 B2 * | 3/2010 | O'Hara et al. | | 700/121 |
| 7,691,204 B2 * | 4/2010 | Chacin et al. | | 118/725 |
| 7,778,533 B2 * | 8/2010 | Aderhold et al. | | 392/418 |
| 2002/0139790 A1 * | 10/2002 | Adams et al. | | 219/390 |
| 2003/0029859 A1 * | 2/2003 | Knoot et al. | | 219/483 |
| 2003/0036877 A1 * | 2/2003 | Schietinger | | 702/134 |
| 2003/0196996 A1 * | 10/2003 | Jennings et al. | | 219/121.73 |
| 2004/0065657 A1 * | 4/2004 | Adams et al. | | 219/444.1 |
| 2004/0069234 A1 * | 4/2004 | Kasai et al. | | 118/725 |
| 2005/0182149 A1 * | 8/2005 | Crivello | | 522/4 |
| 2006/0057826 A1 * | 3/2006 | De Boer | | 438/482 |
| 2007/0062439 A1 * | 3/2007 | Wada et al. | | 117/89 |

FOREIGN PATENT DOCUMENTS

| | | |
|---|---|---|
| WO | WO 01/50109 A2 * | 7/2001 |
| WO | 02065521 A | 8/2002 |

* cited by examiner

SYSTEM AND METHOD FOR SUPPRESSION OF WAFER TEMPERATURE DRIFT IN COLD-WALL CVD SYSTEMS

CROSS REFERENCE TO RELATED APPLICATION

This application claims the benefit of U.S. provisional application Ser. No. 60/431,841 filed 9 Dec. 2002, which is incorporated herein by reference.

FIELD OF THE INVENTION

The present invention relates to the field of semiconductor wafer manufacturing. More particularly, the invention relates to a method and system for controlling and/or compensating for varying wafer temperature during non-selective epitaxial growth.

BACKGROUND OF THE INVENTION

Epitaxy is used in the semiconductor industry to grow a layer of semiconductor material on top of a single-crystalline semiconductor substrate in such a way that the crystal lattice is maintained. Common examples are the growth of an epitaxial silicon layer on top of a silicon substrate or the growth of a SiGe alloy layer on top of a silicon substrate. This can be done by chemical vapor deposition (CVD) in a proper environment. The wafer is heated to a suitable temperature and gases containing the required components are passed over the substrate, which usually is a silicon wafer. To avoid growth on the walls of the reactor vessel it is advantageous to heat just the wafer and to keep the reactor walls at a relatively low temperature.

Common epitaxial reactors used in the semiconductor industry consist of a transparent quartz reactor chamber through which the gas is passed. Inside the quartz chamber the substrate is located on top of a susceptor. The wafer and susceptor are irradiated by high intensity lamps and heated to the desired temperature. As the quartz walls of the reactor chamber absorb comparatively little radiation they can easily be cooled. The temperature of the susceptor is measured and controlled; it is assumed that the wafer has approximately the same temperature as the susceptor.

FIGS. 1a and 1b illustrate a simple case. A susceptor 10, usually a graphite disk with a SiC coating, has a pocket 11 machined in its top surface to hold a wafer (not shown). The temperature of the susceptor 10 is measured by a pyrometer 12 aimed at the backside of the susceptor 10. The pyrometer can also be aimed at the top surface of the wafer, directly measuring the wafer temperature. However, since the emissivity of the wafer surface is not constant, especially when patterned wafers have to be deposited, this is not a good method to measure the wafer temperature. In order to improve the uniformity of the deposited layer the susceptor 10 can rotate during the deposition process.

FIGS. 2a, 2b and 2c show a more complicated case. A susceptor 20 consists of two parts: a rotating inner part 21 and a stationary outer part 22 as shown in FIG. 2a. The rotating inner part 21 holds a wafer (not shown) in a pocket 23 and rotates. The stationary outer part 22 (e.g., a ring) of the susceptor 20 is made of the same material as the rotating inner part 21, but does not rotate. This is done to enable a temperature measurement to be done with thermocouple 28 (shown in cross section in FIG. 2c).

A small pocket 25 centered at the backside of the susceptor 20 (shown in cross section in FIG. 2b) is intended to receive the tip of the thermocouple 24 as shown in FIG. 2c. The thermocouple 24 rotates together with the rotating inner part 21. The stationary outer part 22 holds one or more thermocouples 28 via a thermocouple bore 26 to measure the temperature at the wafer edge. All the thermocouples 24 and 28 are tied to a temperature control system 27 allowing for a very accurate control of the temperature at the center and the edge of the susceptor 20.

While these arrangements have proven useful, significant shortcomings exist with these arrangements.

SUMMARY OF THE INVENTION

The Applicant of the present invention has realized that there are several significant shortcomings of the conventional systems discussed above. As discussed more below, there is a problem caused by varying wafer temperature during non-selective epitaxial and poly-silicon growth on patterned wafers at low temperatures and reduced pressure.

One aspect of the present invention is directed to a method and apparatus that uses one or more optical fibers in a susceptor that monitor radiation emitted by the backside of the wafer. There are several benefits of this type of configuration, e.g.:

(1) the quality of epi layers improves because dopant and Ge levels are more stable throughout the layer of a wafer; and
(2) tuning efforts to grow a specific layer or layer sequence in a wafer can be significantly reduced.

One embodiment of the present invention is directed to a wafer manufacturing apparatus including a susceptor including a support for a wafer, at least one optical fiber connected to the susceptor so that radiation from a bottom side of the wafer can be monitored, and an optical signal measurer coupled to the at least one optical fiber.

Another embodiment of the present invention is directed to a method for manufacturing a wafer using an expitaxy process. The method includes the steps of receiving an optical radiation signal from a backside of a wafer, filtering out a spectrum of the radiation signal for which the wafer is opaque and converting the filtered radiation signal into an electrical signal. The method also includes the step of controlling a wafer temperature by keeping the electrical signal constant during a deposition cycle.

Yet another embodiment of the present invention is directed to a method to decrease temperature differences between wafers with different patterns or different thickness of the field oxide or nitride in epitaxial reactors. The method includes the steps of heating a wafer to a deposition temperature at a first pressure, registering a first radiation signal level from a backside of the wafer and during a subsequent deposition cycle at a second pressure that is less than the first atmospheric pressure, controlling a temperature so that a second radiation signal level from the backside of the wafer is substantially equal to the registered first radiation signal level.

This brief summary has been provided so that the nature of the invention may be understood quickly. A more complete understanding of the invention can be obtained by reference to the following detailed description of the preferred embodiments thereof in connection with the attached drawings.

DETAILED DESCRIPTION

Figure 1A:
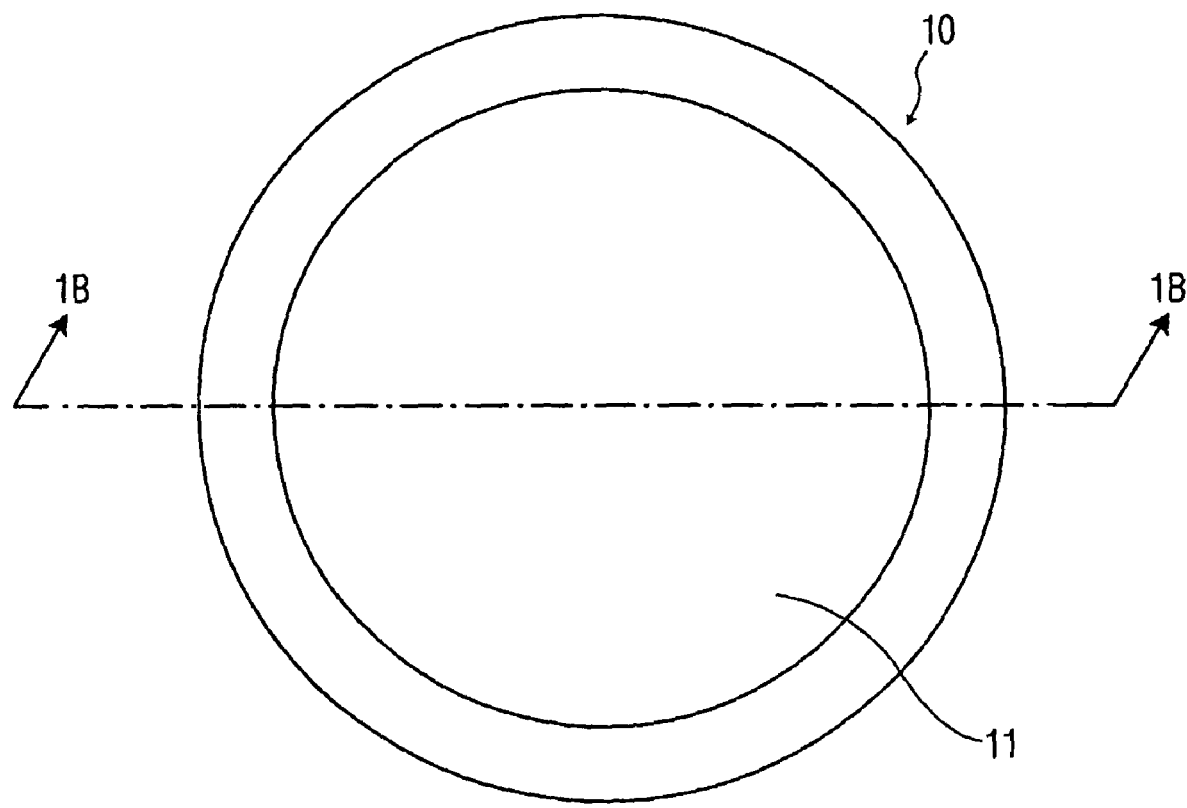
FIG. 1 depicts a prior art susceptor in an epitaxial reactor.

The assumption that a wafer is at approximately the same temperature as a susceptor is sufficiently close to reality at high temperatures. In this regard, high temperatures being defined as a temperature regime in which the growth rate is "transport limited." The diffusion of fresh reactants to the surface of the wafer is the limiting factor and in this regime the growth rate is only moderately dependent on the temperature at high temperatures. Above 850-900° C. in case of silicon epitaxy, the systems described above may provide satisfactory results. However, at low temperatures this is no longer the case. There are two reasons why the susceptor temperature is an insufficient measure of the wafer temperature in the low-temperature range. In this regard, low-temperatures being defined as a temperature regime in which the growth rate is not "transport limited."

First, it is noted that at low-temperatures, the growth rate of the wafer now is a strong function of the temperature. At low temperatures, for silicon epi below 850° C., the growth rate is determined by the reaction rate. The growth is said to be in the "kinetically controlled" regime, characterized by a strong temperature dependency. In this case, a temperature difference between the wafer and susceptor is much more noticeable at low temperature than it is at high temperature.

Next it is noted that at lower temperatures, the heat transfer between the wafer and susceptor shifts from being dominated by radiation to being dominated by conduction. A thin gas film formed between the susceptor and the wafer can play an important role and the heat transfer decreases when the pressure is reduced. This implies that there can be a substantial temperature difference between the wafer and the susceptor at low temperatures and at reduced pressure.

As discussed in the "Emissivity Effects in Low-Temperature Epitaxial Growth of Si and SiGe", W. B. de Boer et al., Electrochemical Society Proceedings Vol. 99-10, incorporated herein by reference, the temperature difference (between the wafer and the susceptor) is not the major problem. The problem is that during the growth on patterned wafers, the emissivity of the wafer changes. This changes the heat flux between wafer and susceptor, which in turn causes the wafer temperature to change during the growth. This rather unpredictable temperature drift may cause one or more harmful effects:

i) the growth rate changes during the deposition, the layer thickness of the wafer does not increase linearly with the deposition time;
ii) the incorporation of, e.g., B and P is not constant and changes during the deposition;
iii) when growing SiGe alloy layers, the Ge content varies during the deposition; and
iv) when switching to a different pattern or a different thickness of field oxide or nitride, the wafer temperature can be different and one has to go through an elaborate retuning procedure.

The varying emissivity of the wafer and the more constant emissivity of the susceptor edge around the wafer also causes a center-to-edge effect on the wafer. The temperature at the center changes differently from the temperature at the edge of the wafer during the growing cycle, i.e., the center-to-edge variation of the layer thickness and dopant concentration changes with increasing layer thickness and changes with the pattern.

The problems described here are characteristic of so-called cold-wall reactors and are irrespective of the heating method. In this regard, due to the high temperature dependency of the growth rate and of parameters like B and Ge incorporation into the growing layers, the problems manifest themselves, for example, when blanket layers are grown on patterned wafers at low temperature and reduced pressure. During the blanket deposition of silicon, an epitaxial layer is deposited in windows where underlying silicon is exposed and a polysilicon (or poly-SiGe) layer is deposited on top of the oxide or nitride. It is the growth on top of the oxide and/or nitride layers usually covering more than 90% of the wafer surface, which changes the emissivity of the wafer, resulting in temperature variations.

One possible method to address the problem described above would be to measure the true wafer temperature, e.g. with a pyrometer aimed through the quartz reactor wall at the wafer with proper optics. However, this has not been possible in the present generation of epitaxial reactors for various practical reasons. The fundamental problem is that the emissivity of the top surface of the wafer is changing during the growth, especially when patterned wafers are deposited of course. The radiation energy picked up by the pyrometer can only be translated into a temperature when the emissivity of the radiating subject is known. Consequently, the pyrometer reading of the radiating top surface of a wafer which emissivity is changing cannot be converted into a temperature unless the emissivity is known, which is not the case in this arrangement.

Other difficulties, less fundamental but still problematic, are that the pyrometer (1) tends to pick up scattered radiation from heating lamps and (2) quartz process tubes tend to get a thin coating during the deposition. Both of these effects tend to disturb an accurate temperature reading. As should be appreciated, measuring the susceptor temperature in contrast to measuring the wafer temperature, by means of a pyrometer is possible but less than ideal and sensitive to drift.

One embodiment of the present invention is directed to circumventing these difficulties and at the same time solving the problem of the varying wafer temperature. This is accomplished by inserting an optical fiber in a susceptor underneath a wafer in such a way that it receives (monitors) radiation from the backside of the wafer.

It is noted that an optical fiber inserted in a susceptor may be used in e.g. sputtering and Reactive Ion Etch (RIE) equipment. The purpose of the optical fibers in this case, however, is wafer temperature measurement for which the backside emissivity has to be known. In addition, optical temperature measurements, using pyrometers and/or optical fibers are common in Rapid Thermal Processing (RTP) equipment. But again in this case, this arrangement only considers true wafer temperature measurements for which the emissivity of the wafer has to be known.

The optical fiber is to be coupled to a measuring device. Such measuring devices are well known in the art and are not described in detail herein. A section from the spectrum for which the wafer is opaque is filtered (band-pass filter). The optical signal is then converted into an electrical signal using a transducer.

To maintain a constant wafer temperature, the electrical signal should be kept constant during the deposition cycle. This is easily achieved by a dedicated control system. The backside of the wafer may or may not be coated. The only requirement is that the optical signal is kept constant from the start of deposition.

Figure 1B:
Figure 2A:
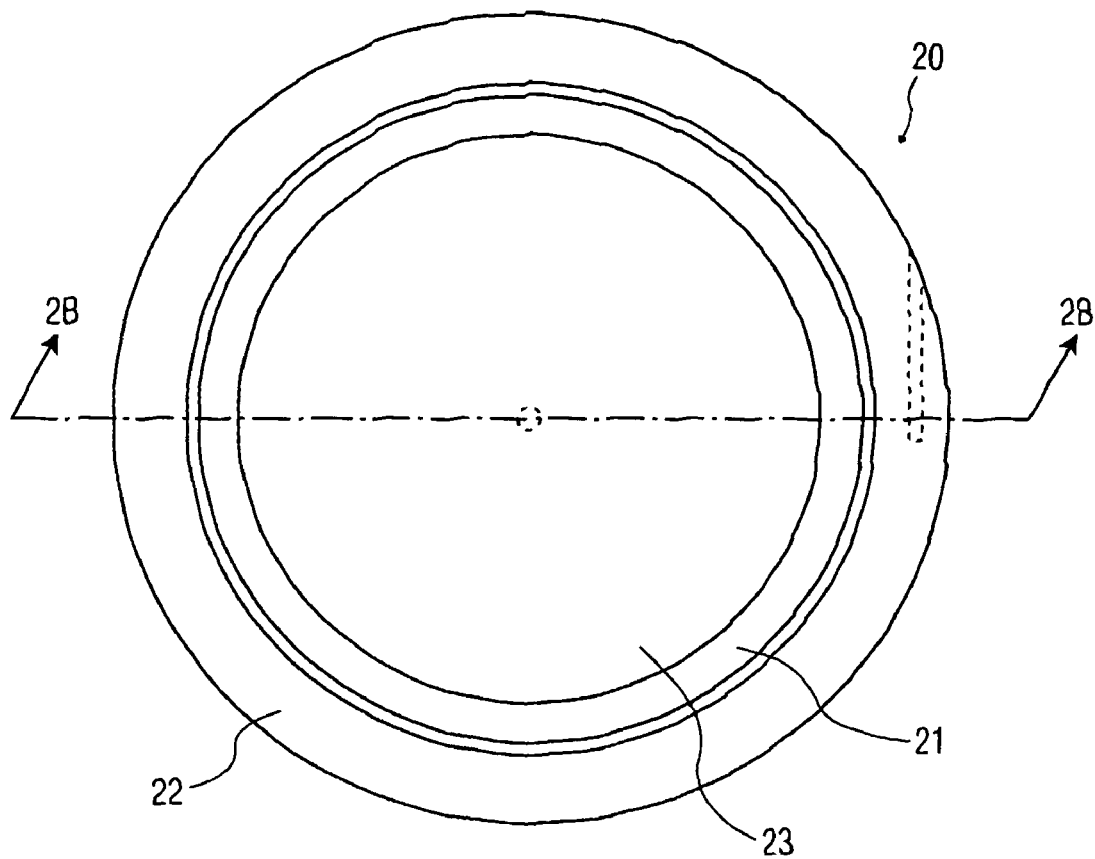
FIG. 2 depicts another prior art susceptor in an epitaxial reactor.
Figure 2B:
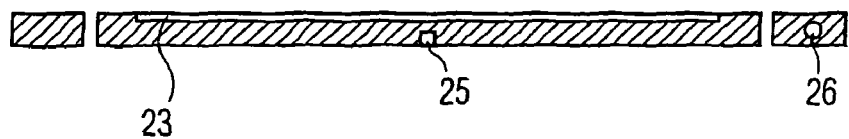
Figure 2C:
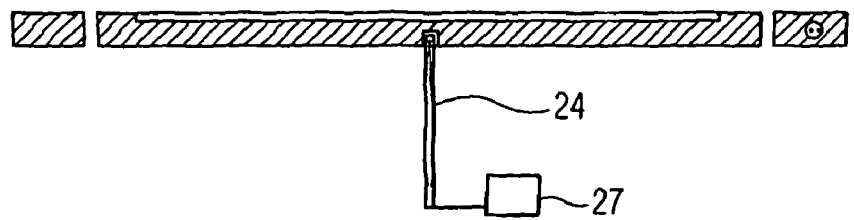

It is noted that the conventional susceptor temperature measurement system (i.e., element 12 in FIG. 1 and elements 24, 28 and 27 in FIG. 2) described above is not modified. It is also noted that the emissivity of the backside of the wafer does not play a role in this arrangement.

In another embodiment, one or more optical fibers may be inserted into the susceptor. In this arrangement, one optical fiber monitors a center of the wafer and a second optical fiber monitors an edge of the wafer. By keeping both optical signals constant from the onset of the deposition, the center to edge variations can also be suppressed. It is noted that the emissivity of the wafer backside at the center and at the edge of the wafer does not need to be the same. Inserting additional optical fibers is also possible, but the improvement in performance should be balanced with the increased complexity of the measure/control system.

Those skilled in the art will also realize that the solution to the wafer temperature varying during the deposition cycle, as described here, can also be used to decrease temperature differences that exist in the conventional (epitaxial) reactors between wafers with different patterns or different thickness of the field oxide or nitride.

Since the conventional temperature measurement system (described above) has not been modified, it can be used in conjunction with various embodiments of the present invention to calibrate the wafer temperature. The procedure is as follows: a wafer is heated to a deposition temperature at a first pressure (e.g., an atmospheric pressure). In this configuration, the thermal coupling between the wafer and the susceptor is good and the temperature difference between wafer and susceptor is small. The signal levels from the optical sensors are registered and during the subsequent deposition cycle at reduced pressure the temperature has to be controlled in such a way that the signals of the optical sensors are substantially restored to the registered value. This procedure calibrates the wafer temperature regardless of the pattern and will result in substantial savings in setting up the reactor for wafers with different masks and different thickness of dielectric.

Figure 3A:
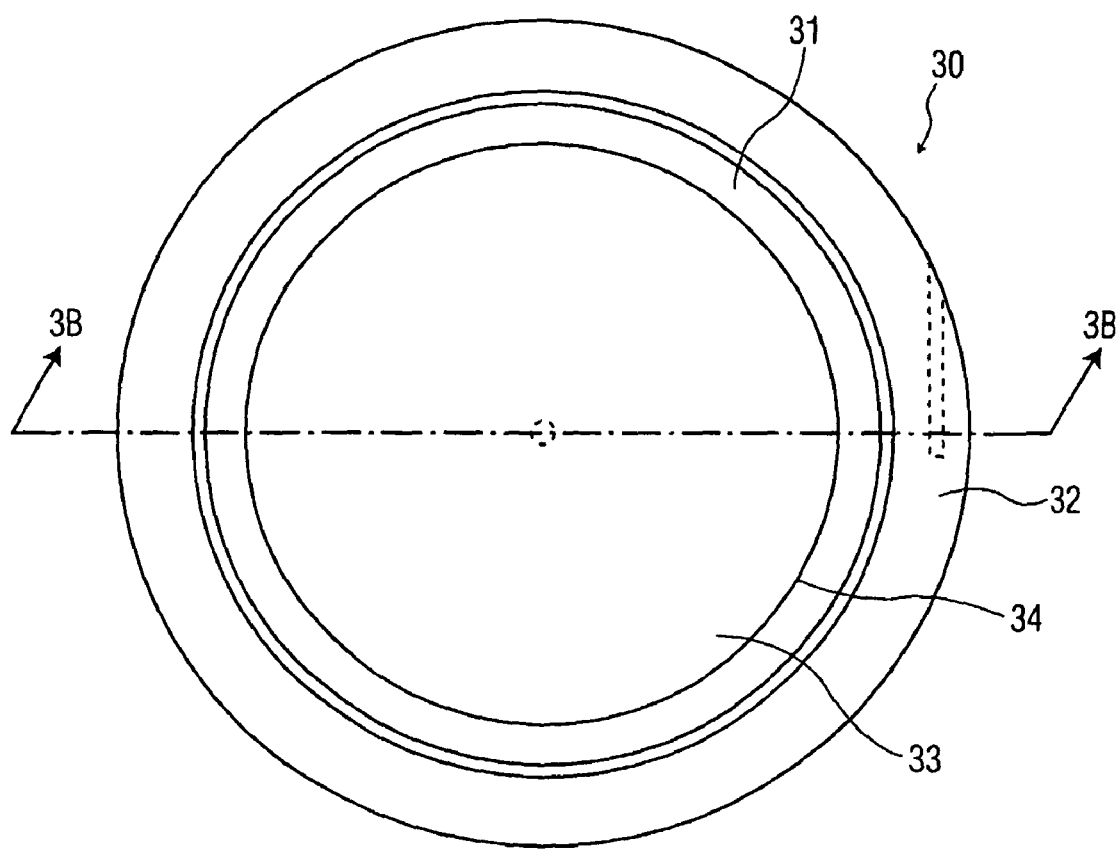
FIG. 3 depicts a susceptor in accordance with a preferred embodiment of the present invention.
Figure 3B:
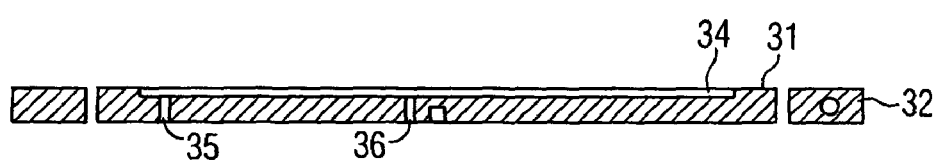
Figure 3C:
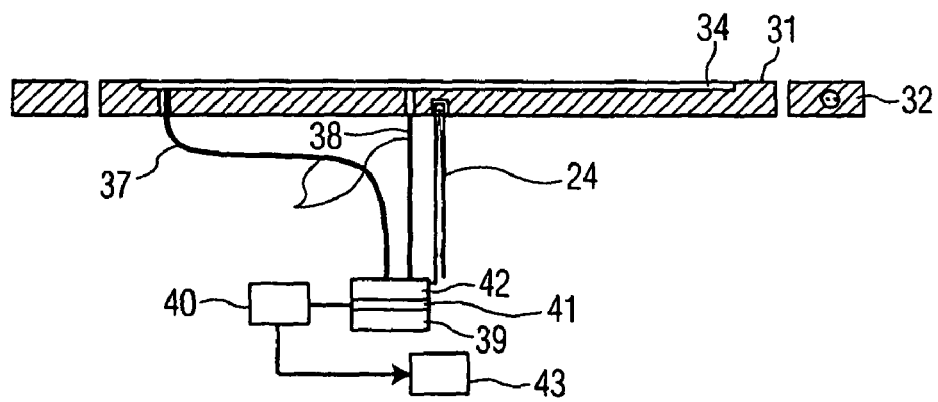

FIGS. 3a, 3b and 3c are block diagrams of a susceptor 30 in accordance with a preferred embodiment of the invention. The susceptor 30 consists of two parts: a rotating inner part 31 and a stationary outer part 32 as shown in FIG. 3a. The rotating inner part 31 holds a wafer 33 in a pocket 34. It is noted that this block diagram shows a complicated case, i.e., an arrangement that uses thermocouples 24 and 28 for the temperature measurement. Simpler arrangements may also be used for the susceptor 30, e.g., without the thermocouples 24 and/or 28 or with only one optical fiber.

As shown in FIG. 3b, two holes 35 and 36 are drilled through the susceptor 30. One hole 36 is located near the center of the susceptor 30 and the other hole 35 is located near the edge of the wafer 33. Optical fibers 37 and 38 are inserted in the respective holes 35 and 36 so as to pick up the radiation emitted by the backside of the wafer 33 (FIG. 3c). The optical fibers 37 and 38 can, for example, be made of sapphire ($Al_2O_3$) when very high temperatures are used during the process or quartz ($SiO_2$) when the temperatures are in the moderate range. The optical fibers 37 and 38 may also be integrated in the (quartz) structure that supports the susceptor 30 (not drawn).

The optical fibers 37 and 38 are coupled to a measuring device 39. A section from the spectrum for which the wafer is opaque (band-pass filter) is filtered. The optical signals are then converted into an electrical signal using a transducer 40, which provides a feedback control signal. A control system 43 receives the feedback control signal and maintains, for example, a constant wafer temperature during a deposition cycle in accordance with the feedback control signal.

The susceptor 30 rotation complicates the coupling of the optical signal to the measuring device 39. Rather than transforming the optical signals from the optical fibers 37 and 38 into electrical signals (e.g., before transmission over sliding contacts), as is done with the thermocouple 24 signal, it is preferable to optically couple the rotating optical fibers 37 and 38 to a stationary monitoring device 41. During one susceptor 30 revolution, each of the optical fibers 37 and 38 transmit optical signals during a short period of the rotation cycle to the monitoring device 41 when passing by, via an optical multiplexer 42. This allows for the number of components/parts of the overall system to be minimized and also allows both signals from the optical fibers 37 and 38 to follow the same optical and electrical path, which reduces the influence of drift in the signal-processing path.

The present invention has been described with respect to particular illustrative embodiments. It is to be understood that the invention is not limited to the above-described embodiments and modifications thereto, and that various changes and modifications may be made by those of ordinary skill in the art without departing from the spirit and scope of the appended claims.

The invention claimed is:

1. A wafer manufacturing apparatus comprising:
    a susceptor including a support for a wafer, the wafer including a topside and a bottom side;
    at least one optical fiber connected to the susceptor so that radiation from the bottom side of the wafer can be monitored;
    an optical signal measurer coupled to the at least one optical fiber, the optical signal measurer generating an electrical signal responsive to the radiation measured from the bottom side of the wafer; and
    a control system that is configured to maintain a deposition temperature of the wafer by
        calibrating the optical signal measurer by
            measuring a temperature of the susceptor at a first gas pressure;
            determining a signal level of the electrical signal when the measured temperature of the susceptor is at the deposition temperature, and by
            keeping, during a subsequent deposition cycle at a second gas pressure that is less than the first gas pressure, the electrical signal constant at the determined signal level.

2. The wafer manufacturing apparatus according to claim 1, wherein two optical fibers are connected to the susceptor, a first optical fiber being located near a center of the susceptor and a second optical fiber being located near an edge of the wafer.

3. The wafer manufacturing apparatus according to claim 2, wherein the optical signal measurer generates a first electrical signal from radiation monitored from the bottom side of the wafer by the first optical fiber and the optical signal measurer generates a second electrical signal from radiation monitored from the bottom side of the wafer by the second optical fiber, and wherein the control system maintains a temperature of the wafer at the center to keep the first electrical signal constant during the deposition cycle and the control system maintains a temperature of the wafer at the edge to keep the second electrical signal constant during the deposition cycle.

4. The wafer manufacturing apparatus according to claim 3, wherein the control system is configured to keep the first electrical signal constant during the deposition cycle without determining the temperature of the susceptor at the center and to keep the second electric signal constant during the deposition cycle without determining the temperature of the susceptor at the edge.

5. The wafer manufacturing apparatus according to claim 1, wherein the optical signal measurer filters an optical signal from the at least one optical fiber, converts the filtered optical signal into the electrical signal and provides the electrical signal as a feedback control signal to the control system.

6. The wafer manufacturing apparatus according to claim 5, wherein the optical signal measurer is configured to filter out a spectrum of the optical signal for which the wafer is opaque.

7. The wafer manufacturing apparatus according to claim 1, wherein the at least one optical fiber is inserted into a hole in the susceptor to access the bottom side of the wafer.

8. The wafer manufacturing apparatus according to claim 1, wherein the at least one optical fiber comprises sapphire.

9. The wafer manufacturing apparatus according to claim 1, wherein the at least one optical fiber comprises quartz.

10. The wafer manufacturing apparatus according to claim 1, wherein the optical fiber is integrated in a structure that supports the susceptor.

11. The wafer manufacturing apparatus according to claim 1, wherein the susceptor includes a rotating part and a stationary part.

12. The wafer manufacturing apparatus according to claim 11, further comprising a thermocouple or a pyrometer arranged to measure a temperature of the susceptor.

13. The wafer manufacturing apparatus according to claim 11, wherein optical signals from the at least one optical fiber couple to the optical signal measurer via a stationary monitoring device.

14. The wafer manufacturing apparatus according to claim 1, further comprising a pyrometer that is configured to measure a temperature of the susceptor, wherein the pyrometer is not part of the optical signal measurer.

15. The wafer manufacturing apparatus according to claim 1, wherein the optical signal measurer includes a transducer that is configured to generate the electrical signal.

16. A method for manufacturing a wafer using an epitaxy process that involves heating the wafer to a deposition temperature, the method comprising the steps of:
during a high-pressure calibration mode:
heating a susceptor and a wafer at a high-gas pressure;
receiving an optical radiation signal from a backside of the wafer;
filtering out a spectrum of the radiation signal for which the wafer is opaque;
converting the filtered radiation signal into an electrical signal;
measuring the temperature of a susceptor holding the wafer, and
storing a value of the electrical signal when the measured temperature of the susceptor corresponds to the deposition temperature; and during a subsequent deposition process carried out at a lower-gas pressure than the high-gas pressure:
controlling a wafer temperature by keeping, the electrical signal constant at the stored value.

17. The method according to claim 16, wherein the receiving step includes receiving a first optical radiation signal from a center of the wafer and a second optical radiation signal from an edge of the wafer.

18. The method according to claim 17, wherein the controlling step includes keeping the first and second optical radiation signals constant from an onset of the deposition.

19. The method according to claim 16, wherein the receiving step includes receiving the optical radiation signal from a center of the wafer and receiving a further optical radiation signal from an edge of the wafer, the filtering step includes filtering out a spectrum of the further optical radiation signal for which the wafer is opaque, the converting step includes converting the filtered further optical radiation signal into a further electrical signal, and the controlling step includes controlling a wafer temperature at the edge of the wafer by keeping the further electrical signal constant during the deposition cycle.

20. The method according to claim 19, wherein the controlling step includes keeping the electrical signal constant during the deposition cycle without determining the susceptor temperature at the center of the wafer and keeping the further electric signal constant during the deposition cycle without determining the susceptor temperature at the edge of the wafer.

* * * * *